United States Patent
Sadri et al.

(10) Patent No.: US 12,538,462 B2
(45) Date of Patent: Jan. 27, 2026

(54) COOLER FOR POWER ELECTRONICS

(71) Applicant: Atieva, Inc., Newark, CA (US)

(72) Inventors: Samaneh Sadri, Redwood City, CA (US); Jonathan Luna, Union City, CA (US); Jerome Jambon, Fremont, CA (US); Bradley Lucas Hall, Newark, CA (US)

(73) Assignee: Atieva, Inc., Newark, CA (US)

( * ) Notice: Subject to any disclaimer, the term of this patent is extended or adjusted under 35 U.S.C. 154(b) by 279 days.

(21) Appl. No.: 18/351,361

(22) Filed: Jul. 12, 2023

(65) Prior Publication Data

US 2024/0074124 A1 Feb. 29, 2024

Related U.S. Application Data

(60) Provisional application No. 63/373,773, filed on Aug. 29, 2022.

(51) Int. Cl.
*H05K 7/20* (2006.01)

(52) U.S. Cl.
CPC ..... *H05K 7/20927* (2013.01); *H05K 7/20254* (2013.01); *H05K 7/20272* (2013.01)

(58) Field of Classification Search
CPC ............ H01L 21/4882; H01L 21/4871; H01L 23/3677; H01L 23/473; H05K 7/20927; H05K 7/20254; H05K 7/20272; H05K 1/181; H05K 1/0203
See application file for complete search history.

(56) References Cited

U.S. PATENT DOCUMENTS

| | | | |
|---|---|---|---|
| 6,031,751 A * | 2/2000 | Janko | F28F 13/00 165/80.4 |
| 6,959,492 B1 | 11/2005 | Matsumoto et al. | |
| 8,755,185 B2 * | 6/2014 | Chou | H01L 24/33 165/80.4 |
| 11,391,520 B2 * | 7/2022 | Xiao | F28F 1/126 |
| 11,414,202 B2 | 8/2022 | Tomescu et al. | |
| 11,596,088 B2 * | 2/2023 | Zhou | H05K 7/20927 |
| 11,849,569 B2 * | 12/2023 | Zhou | H05K 7/20254 |
| 2004/0026072 A1 * | 2/2004 | Yi | F28D 1/0341 165/175 |

(Continued)

FOREIGN PATENT DOCUMENTS

| | | |
|---|---|---|
| CN | 112928082 A | 6/2021 |
| EP | 3770958 A1 | 1/2021 |
| JP | 2019168190 A | 10/2019 |

OTHER PUBLICATIONS

International Search Report and Written Opinion for PCT Application No. PCT/US2023/070066, mailed on Oct. 12, 2023, 13 pages.

*Primary Examiner* — Adam B Dravininkas
(74) *Attorney, Agent, or Firm* — Brake Hughes Bellermann LLP

(57) ABSTRACT

Coolers for power electronics have mounting surfaces for power electronics modules and provide coolant flow using coolant paths. Base plates for power electronics can include pin fins. An inlet manifold can extend in a space between base plates. Parallel flows of coolant can abut respective halves of mounting surfaces so that a fluid volume includes multiple subplate portions. Coolers can be manufactured by casting, molding, or lamination.

20 Claims, 11 Drawing Sheets

(56) References Cited

U.S. PATENT DOCUMENTS

| | | | |
|---|---|---|---|
| 2006/0002086 A1* | 1/2006 | Teneketges | H01L 23/473 |
| | | | 257/E23.098 |
| 2009/0283244 A1 | 11/2009 | Bezama et al. | |
| 2014/0043754 A1* | 2/2014 | Hartmann | H05K 7/2039 |
| | | | 29/841 |
| 2014/0119393 A1* | 5/2014 | Schleuning | H01S 5/02476 |
| | | | 372/36 |
| 2014/0158324 A1* | 6/2014 | Tochiyama | H01L 23/473 |
| | | | 165/67 |
| 2017/0055378 A1* | 2/2017 | Zhou | H05K 7/20927 |
| 2018/0142968 A1 | 5/2018 | Deguchi | |
| 2018/0259273 A1 | 9/2018 | Wang | |
| 2020/0295626 A1 | 9/2020 | Yuan et al. | |
| 2022/0015271 A1* | 1/2022 | De Sousa | H01L 23/473 |
| 2023/0022829 A1* | 1/2023 | Zhou | H01L 23/3735 |

* cited by examiner

COOLER FOR POWER ELECTRONICS

CROSS-REFERENCE TO RELATED APPLICATION

This application claims benefit, under 35 U.S.C. § 119, of U.S. Provisional Patent Application No. 63/373,773, filed on Aug. 29, 2022, entitled "COOLER FOR POWER ELECTRONICS", the disclosure of which is incorporated by reference herein in its entirety.

TECHNICAL FIELD

This document relates to a cooler for power electronics.

BACKGROUND

Power electronics are used in a variety of situations. In electric vehicles, they can be included in an inverter that converts direct current from a high-voltage battery pack into alternating current for powering a propulsion motor, or to feed energy recovered from the motor to the battery pack. Similarly, power electronics can be used in non-mobile energy storage systems, for example when serving as a power solution for a house or another building. Common to these examples of uses is that the power electronics generate heat that may need to be managed in some way. Moreover, space constraints can be a factor, such that more compact solutions for thermal control may be favorable.

SUMMARY

In an aspect, a cooler for power electronics comprises: first mounting surfaces for first power electronics modules, respectively; second mounting surfaces for second power electronics modules, respectively, each of the first mounting surfaces being parallel to and overlapping a corresponding one of the second mounting surfaces; and coolant paths extending between an inlet and an outlet, the coolant paths providing parallel flows among the first and second mounting surfaces.

Implementations can include any or all of the following features. Each of the parallel flows initially abuts a first half of a first one of the first mounting surfaces, thereafter abuts a first half of a first one of the second mounting surfaces, thereafter abuts a second half of the first one of the second mounting surfaces, and thereafter abuts a second half of the first one of the first mounting surfaces. The inlet leads to an inlet manifold extending through a space between the first and second mounting surfaces, the inlet manifold positioned substantially at a center of the space. The outlet leads to an outlet manifold, the outlet manifold also extending through the space between the first and second mounting surfaces, the outlet manifold positioned adjacent the inlet manifold. The cooler has three instances of the first mounting surfaces and three instances of the second mounting surfaces. The cooler further comprises first pin fin plates for the first mounting surfaces, respectively, and second pin fin plates for the second mounting surfaces, respectively. The cooler comprises a stack of laminates, the stack of laminates at least in part forming the first and second mounting surfaces, and the inlet and the outlet. The cooler comprises a first piece and a second piece, and wherein the first and second pieces are joined together to at least in part form: the first and second mounting surfaces, and the inlet and the outlet. Each of the first and second pieces is molded. Each of the first and second pieces is 3D printed. Each of the first and second pieces is formed by vacuum infusion. The cooler further comprises an adhesive at a joint between the first and second pieces. The cooler further comprises a seal at a joint between the first and second pieces, and at least one bolt connection between the first and second pieces. The cooler comprises a first metal piece and a second metal piece, and wherein the first and second metal pieces are joined together to at least in part form: the first and second mounting surfaces, and the inlet and the outlet. The first and second metal pieces are cast. The first and second metal pieces are forged. The first and second metal pieces are 3D printed. The cooler further comprises an adhesive at a joint between the first and second metal pieces. The cooler further comprises a seal at a joint between the first and second metal pieces, and at least one bolt connection between the first and second metal pieces. The cooler is cast or molded as a single piece.

BRIEF DESCRIPTION OF DRAWINGS

Like reference symbols in the various drawings indicate like elements.

DETAILED DESCRIPTION

This document describes examples of systems and techniques for cooling power electronics. The present subject matter can provide improved thermal management in terms of efficiency, absolute temperature levels, and/or uniformity of temperature between separate components. Examples of different coolant paths are provided. For example, a design of cooler can be chosen that maximizes cooling efficiency and temperature uniformity.

Examples described herein refer to power electronics. As used herein, power electronics includes any circuitry that converts electric power using solid-state electronics (e.g., one or more semiconductor devices). A power electronics component can include one or more transistors. In some implementations, a metal-oxide semiconductor field-effect transistor (MOSFET) can be used. For example, the power electronics can include one or more silicon carbide MOSFETs. In some implementations, an insulated gate bipolar transistor (IGBT) can be used. The circuitry of the power electronics component can include one or more elements in addition to a switch, including, but not limited to, a diode, resistor, and/or capacitor.

Examples described herein refer to a power electronics module. As used herein, a power electronics module includes at least one power electronics component. In some implementations, a power electronics component includes multiple MOSFETs and/or multiple IGBTs. For example, the power electronics components can be located in respective dies situated in various positions on the power electronics module.

Examples described herein refer to coolant. As used herein, coolant includes any fluid used to regulate temperature. The coolant can include water (optionally with one or more additives), to name just one example. Coolant that passes through a cooler as described herein can be circulated in a thermal system. For example, such a system can also include one or more features for releasing heat, such as by conduction, convection, and/or radiation.

Examples described herein use the term "couple" or a variation of it when describing that a first feature and a second feature are coupled to each other. As used herein, being coupled indicates that the features are in fluid communication with each other. For example, coolant can flow from the first feature to the second feature, and/or can flow from the second feature to the first feature.

Figure 1:
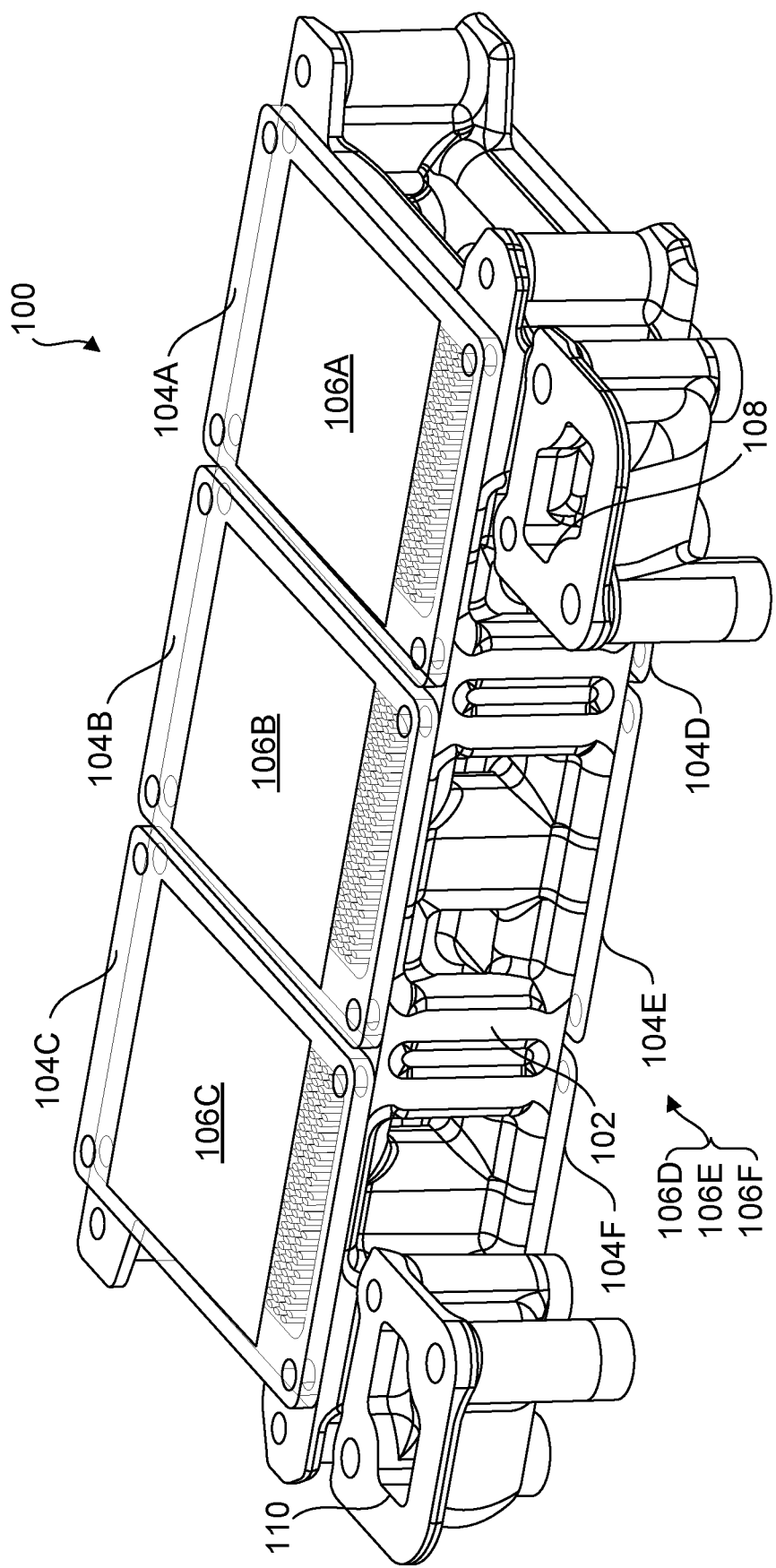
FIG. 1 shows an example of a cooler for power electronics.

FIG. 1 shows an example of a cooler 100 for power electronics. The cooler 100 can be used with one or more other examples described elsewhere herein. The cooler 100 has a cooler manifold 102. The cooler 100 can have multiple base plates mounted to the cooler manifold 102 for holding power electronics. Here, the cooler 100 has base plates 104A, 104B, and 104C mounted to one side of the cooler manifold 102. Base plates on the opposite side of the cooler manifold 102 can be of similar shape to the base plates 104A-104C, are partially obstructed in the present view, and include base plates 104D, 104E, and 104F. Each of the base plates 104A-104F can be attached to any of multiple mounting surfaces of the cooler 100. For example, the base plates 104A-104C can be attached at one mounting surface, and the base plates 104D-104F can be attached to another mounting surface that is parallel to and overlaps the one mounting surface. Other approaches can be used.

Each of the base plates 104A-104F can hold one or more power electronics modules. Power electronics modules are schematically illustrated in the present disclosure. Here, the base plate 104A has a power electronics module 106A, the base plate 104B has a power electronics module 106B, and the base plate 104C has a power electronics module 106C. Power electronics modules on the opposite side of the cooler manifold 102 are obstructed in the present view, and include power electronics modules 106D, 106E, and 106F, each attached to a respective one of the base plates 104D-104F. That is, in the present example the cooler 100 has three mounting surfaces on each of the opposite sides of the cooler manifold 102, for a total of six mounting surfaces. More or fewer mounting surfaces can be used, including unequal numbers of mounting surfaces between the opposing sides.

The cooler 100 has an inlet 108 where coolant can enter, and an outlet 110 where coolant can exit. The cooler manifold 102 forms coolant paths between the inlet 108 and the outlet 110. The terms inlet and outlet, as used in any example described herein, are used for illustrative purposes only. For example, in another implementation, the outlet 110 can instead be where coolant enters the cooler 100, and the inlet 108 can instead be where coolant exits the cooler 100, wherein the flow direction may affect the performance and/or balance of the cooler 100.

Figure 2:
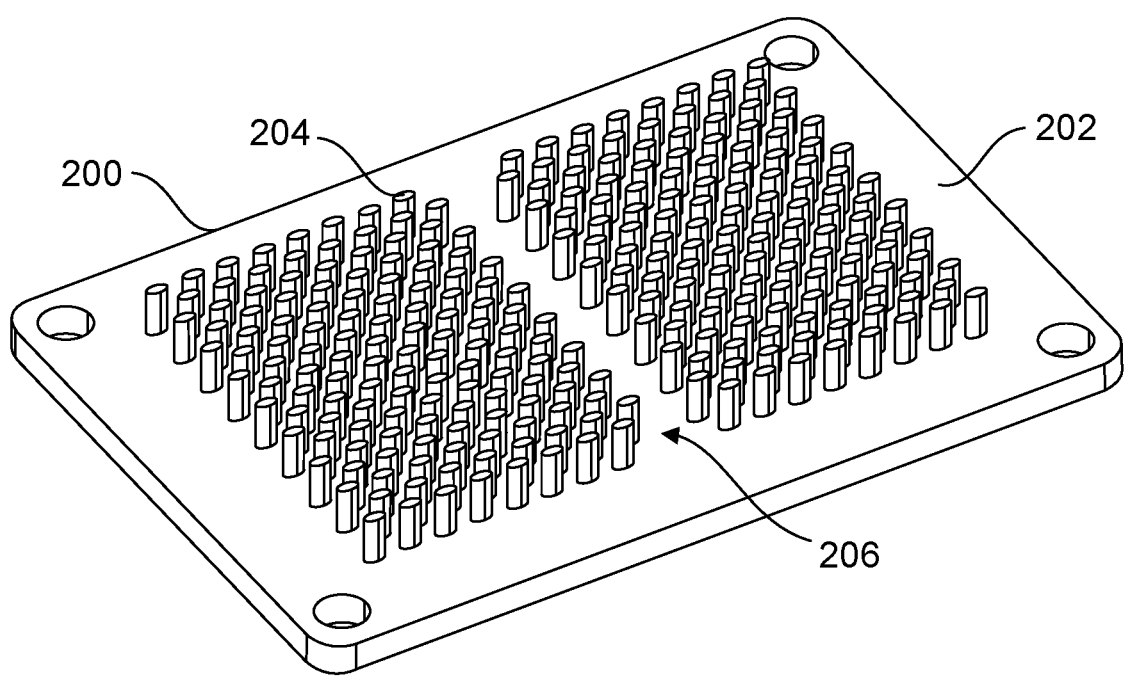
FIG. 2 shows an example of a pin fin plate that can be used with a cooler.

FIG. 2 shows an example of a pin fin plate 200 that can be used with a cooler. The pin fin plate 200 can be used with one or more other examples described elsewhere herein. In some implementations, one or more of the base plates 104A-104F in FIG. 1 can be, or include, an instance of the pin fin plate 200. For example, respective instances of the pin fin plate 200 can be attached at each of the mounting surfaces of the cooler 100 in FIG. 1. The pin fin plate 200 includes a plate 202 on which fins 204 are formed. During use, coolant will contact some or all of the fins 204 to allow heat rejection from the power electronics module(s). Other types of fins, placement of fins, and/or patterns of fins, can be used. The pin fin plate 200 can include at least one separation 206 between the fins 204. In some implementations, the separation(s) 206 can facilitate installation of the pin fin plate 200 against two or more chambers where coolant will flow.

Figure 3:
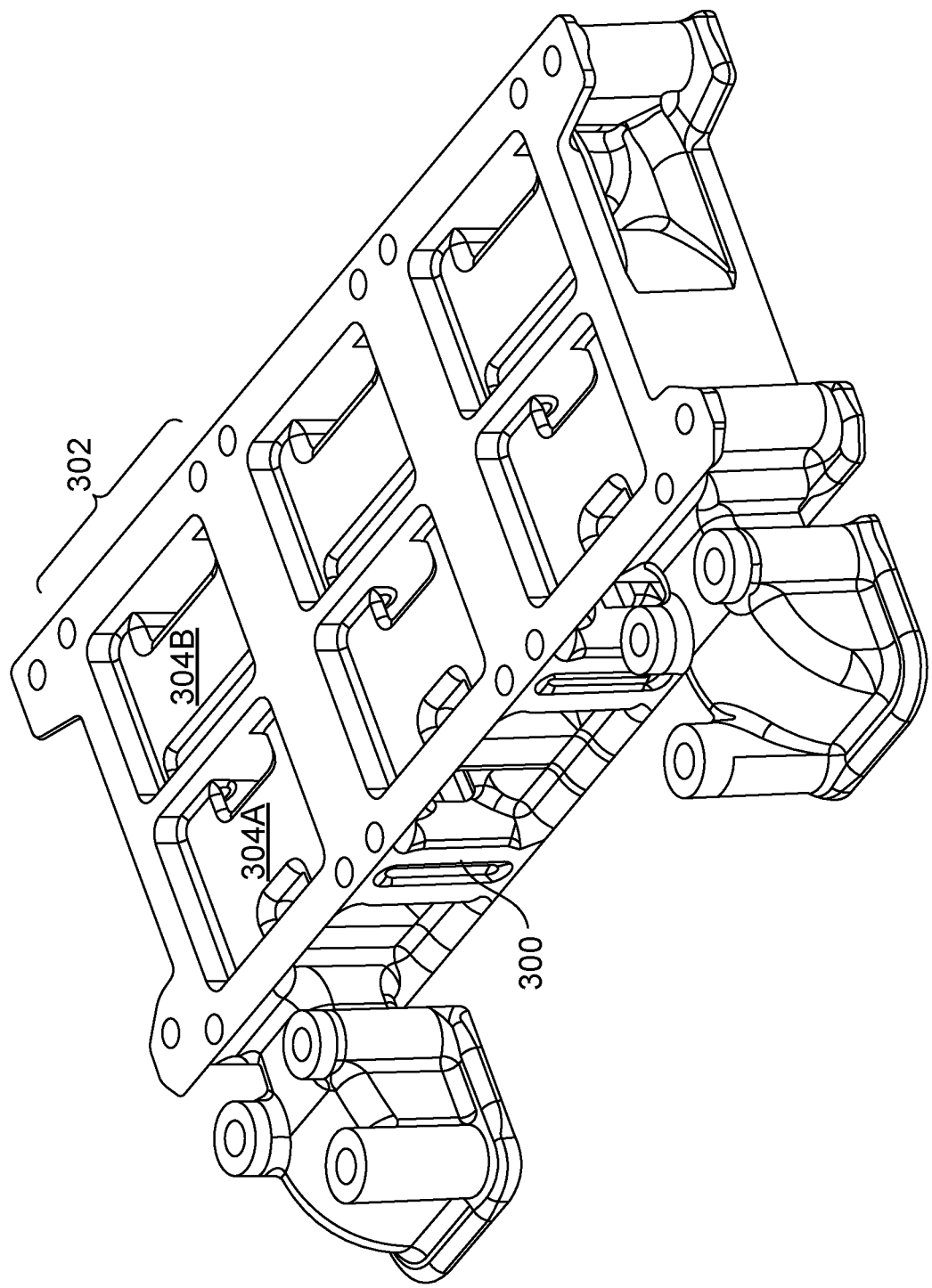
FIG. 3 shows an example of a cooler.

FIG. 3 shows an example of a cooler 300. The cooler 300 can be used with one or more other examples described elsewhere herein. The cooler 300 is configured for having three power electronics modules mounted on each of its two opposing sides. For each of the power electronics modules, the cooler 300 can provide a mounting surface 302, and at least one chamber 304A or 304B. Here, both of the chambers 304A-304B are used for the same power electronics module and will allow coolant to thermally interact with the base plate of the power electronics module to remove heat. The chambers 304A-304B can be part of coolant paths extending through the cooler 300. In some implementations, the coolant paths can provide parallel flows through the cooler 300. For example, such parallel flows can involve coolant traveling through the chambers 304A-304B in series. In at least one of the chambers 304A-304B, the coolant can interact with fins of a pin fin plate for more efficient cooling. With reference again briefly to FIG. 2, one group of the fins 204 defined by the separation 206 can face the chamber 304A, and another group of the fins 204 can face the chamber 304B.

The cooler 300 can be made using any of multiple materials, and any of multiple manufacturing techniques. In some implementations, a single-piece casting or molding process is used. For example, a sacrificial core can be included to form the chambers 304A-304B and the inlet and outlet, the sacrificial core being destroyed after the casting/molding.

Approaches that involve using a cooler with base plates mounted thereto, including, but not limited to the cooler 300 in FIG. 3 and the pin fin plate 200 in FIG. 2, can provide improved thermal control of power electronics. In some implementations, the use of thermal grease between power electronics modules and the cooler can be eliminated. For example, this can significantly reduce the thermal resistance and improve the performance of the cooler. The design or configuration of the pin fin plate 200 can affect performance and efficiency, both in the entire cooler and in terms of the differences between the modules. Operational parameters such as maximum temperature of the power electronics, and pressure drop within the coolant, can be analyzed as a basis for choosing parameters such as pin shape, pin diameter, or pin gap.

Figure 4:
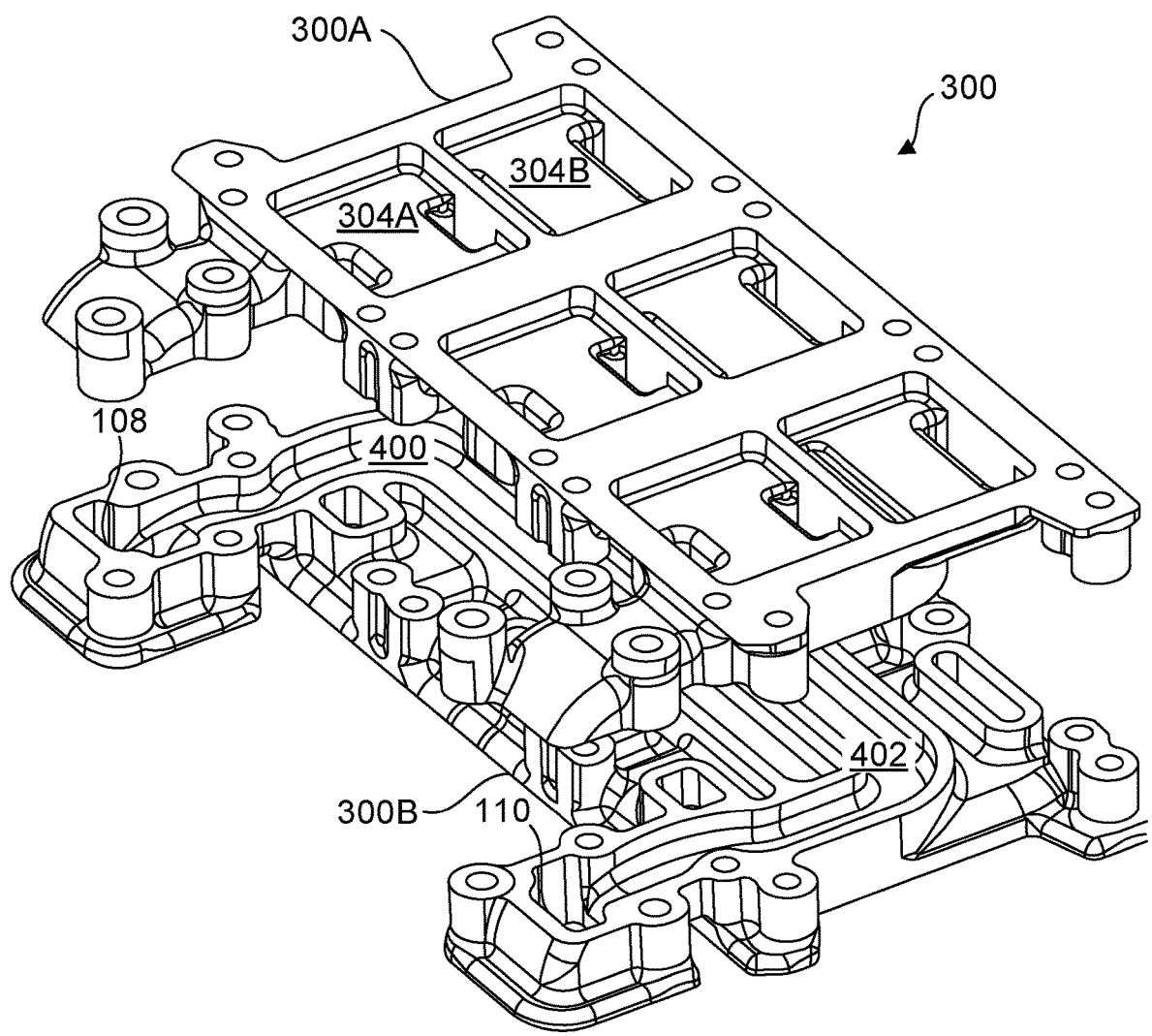
FIG. 4 shows an example of assembling the cooler of FIG. 3.

FIG. 4 shows an example of assembling the cooler 300 of FIG. 3. The cooler 300 can include a part 300A and a part 300B that are designed to fit together to at least in part form the mounting surfaces and the coolant paths of the cooler. In some implementations, the inlet 108 can lead to an inlet manifold 400 that is coupled to respective ones of the chambers 304A-304B. Similarly, the outlet 110 can be positioned at the end of an outlet manifold 402 that is also coupled to respective ones of the chambers 304A-304B. For example, the inlet manifold 400 can be connected to the chamber 304A, from which the coolant can flow through the chambers on the opposite side and exit through the chamber 304B to the outlet manifold 402.

Figure 5:
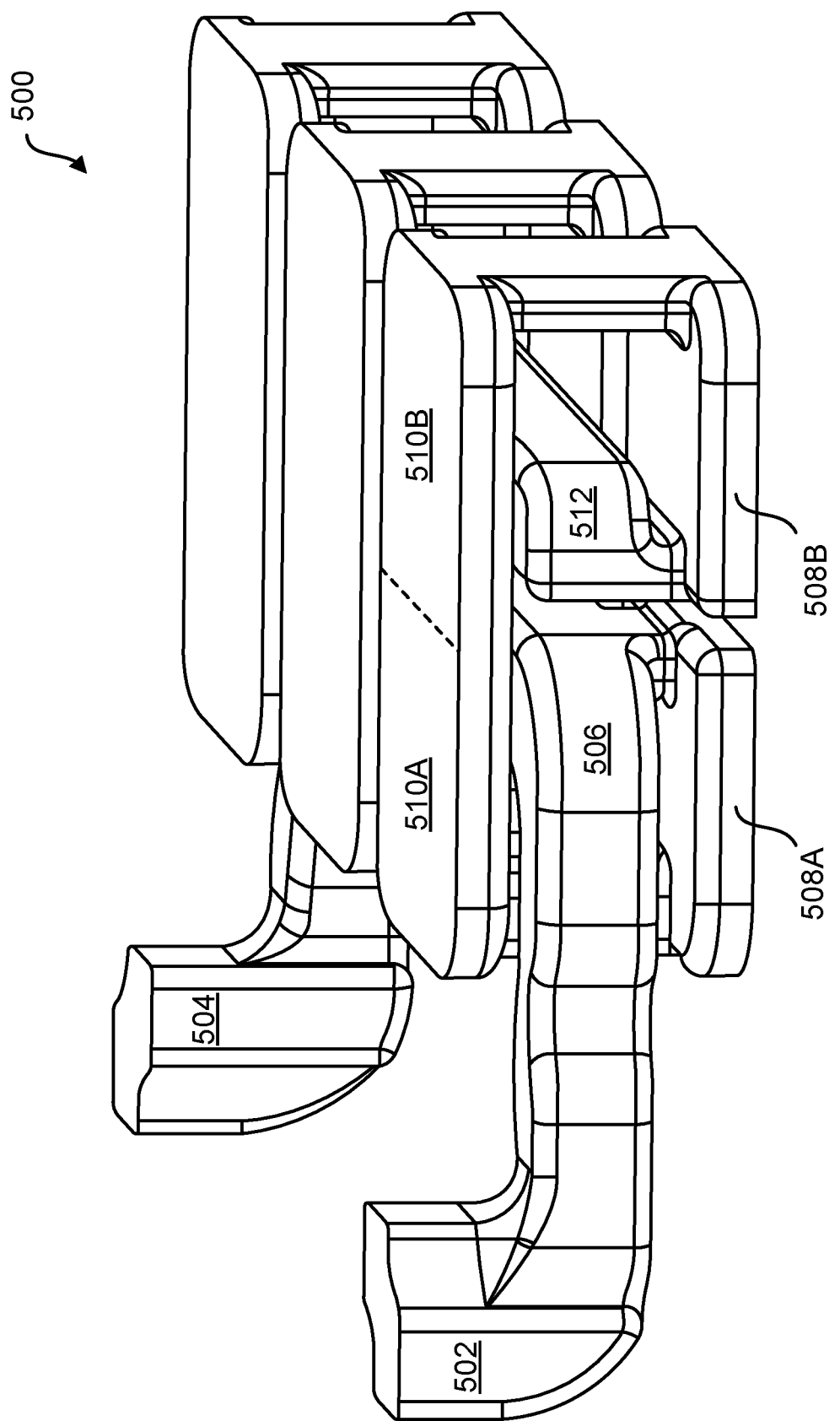
FIG. 5 shows an example of a fluid volume that can be defined by a cooler.
Figure 6:
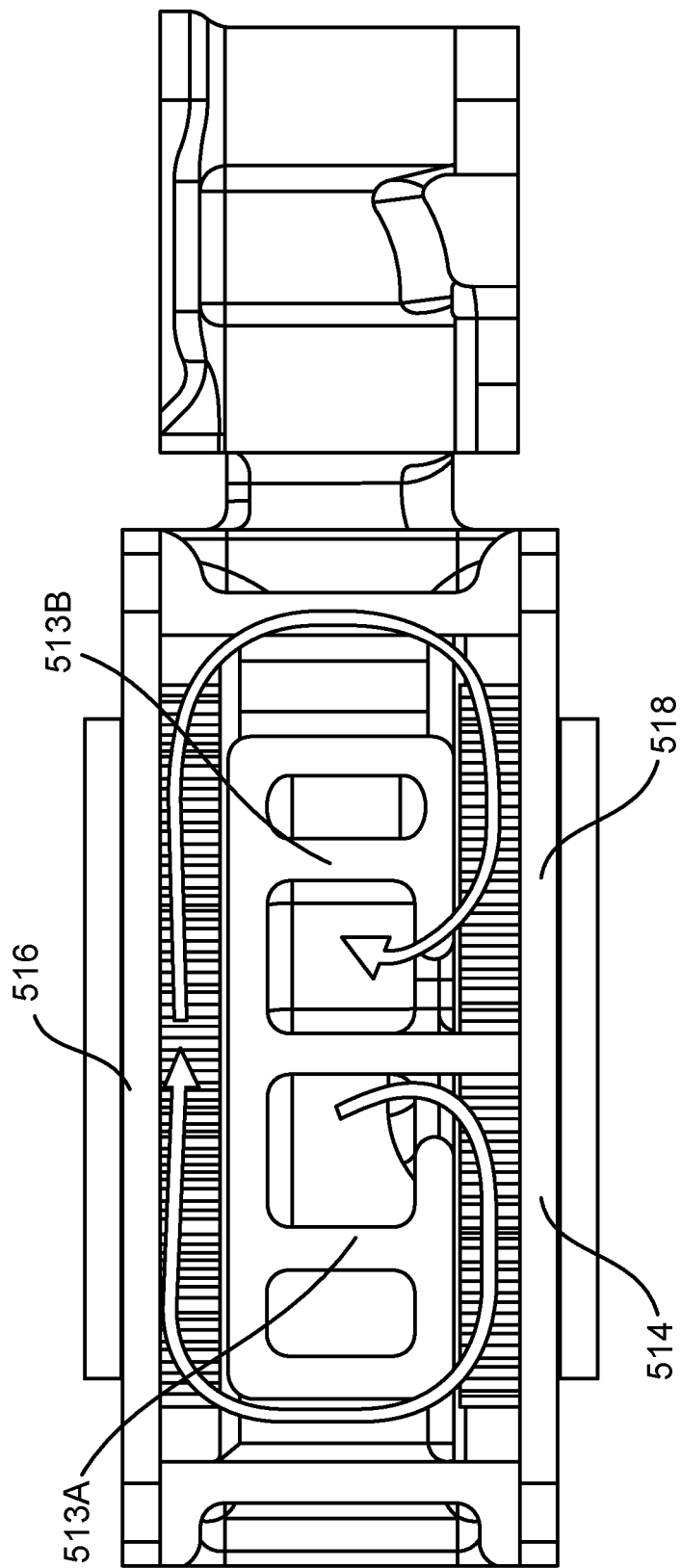
FIG. 6 shows a side view of the fluid volume in FIG. 5.

FIG. 5 shows another example of a fluid volume 500 that can be used with a cooler. FIG. 6 shows a side view of the fluid volume 500 in FIG. 5. The fluid volume 500 can be used with one or more other examples described elsewhere herein. The fluid volume 500 schematically shows the shape that coolant (e.g., a liquid) will have if the coolant entirely fills the inlet, outlet, and coolant paths of a cooler. That is, for clarity the fluid volume 500 here shows only coolant and none of the surrounding structure of the cooler.

The fluid volume 500 has an inlet portion 502 and an outlet portion 504. For example, the inlet portion 502 can be formed by an inlet, and the outlet portion 504 can be formed by an outlet. The fluid volume 500 can have an inlet manifold portion 506 extending from the inlet portion 502. The inlet manifold portion 506 can constitute the branching of the coolant flow into parallel paths. For example, from the inlet manifold portion 506 the flow can continue in a subplate portion 508A, thereafter in a subplate portion 510A, thereafter in a subplate portion 510B, and thereafter in a subplate portion 508B. That is, from the inlet manifold portion 506, the coolant can travel in essentially a clockwise direction (in the present view) through the subplate portions 508A, 510A, 510B, and 508B, in that order. After the subplate portion 508B, the flow can continue in an outlet manifold portion 512 that leads to the outlet portion 504. A subplate portion, as used herein, can refer to portions of coolant flow that are in immediate fluid contact with each other (e.g., the subplate portions 510A-510B), and also portions of coolant flow that are not in immediate fluid contact with each other (e.g., the subplate portions 508A and 508B).

That is, the fluid volume 500 is an example of coolant flow within a cooler where each of the parallel flows initially abuts a first half of a first one of the first mounting surfaces (e.g., with the mounting surface used for the base plate 104D in FIG. 1, the one half that is positioned closer to the inlet 108). The flow thereafter abuts a first half of a first one of the second mounting surfaces (e.g., with the mounting surface used for the base plate 104A in FIG. 1, the one half that is positioned closer to the inlet 108). The flow thereafter abuts a second half of the first one of the second mounting surfaces (e.g., with the mounting surface used for the base plate 104A in FIG. 1, the one half that is positioned farther from the inlet 108). The flow thereafter abuts a second half of the first one of the first mounting surfaces (e.g., with the mounting surface used for the base plate 104D in FIG. 1, the one half that is positioned farther from the inlet 108).

The inlet manifold portion 506 can be formed by an inlet manifold that extends substantially in a space between the respective opposing mounting surfaces (e.g., in FIG. 1, the space between, on the one hand, the base plates 104A-104C, and, on the other hand, the base plates 104D-104F). The inlet manifold can extend substantially in a center of such a space. The outlet manifold portion 512 can be formed by an outlet manifold that also extends through the space between the respective opposing mounting surfaces. The outlet manifold can be positioned adjacent the inlet manifold. As such, the outlet manifold can extend substantially in the center of such a space.

The coolant paths of the fluid volume 500 extending between a cold inlet 513A and a warm outlet 513B can provide one or more advantages. A lower or lowest die temperature can be achieved. A uniform temperature distribution within all dies can be obtained. A location 514 of maximum cooling can exist at the subplate portion 508A, and a location 516 of at least an average cooling can exist at the subplate portion 510A. The average cooling can also be obtained at the subplate portion 510B, and a location 518 of minimum cooling can exist at the subplate portion 508B. In some implementations, any given module may have switches that tend to reach different temperatures during the intended or expected operation. For example, the switch(es) at the subplate portion 508A and the switch(es) at the subplate portion 510A may generally operate at higher temperatures than the switch(es) at the subplate portion 510B and the switch(es) at the subplate portion 508B. Then, another advantage of the present subject matter is that the flow can enter from a relatively hotter switch position for all modules (e.g., by first reaching the subplate portions 508A and 510A), and only thereafter proceeding to the relatively cooler switch position for all modules (e.g., by subsequently reaching the subplate portions 510B and 508B). This approach can reduce the temperature difference between different switch positions within a module. For example, it can be avoided that a particular module is situated upstream in the coolant flow relative to another module that is then situated downstream in the coolant flow. Self-balancing of the thermal conditions between modules can be obtained as modules are not distinctly upstream or downstream in the coolant flow.

Figure 7:
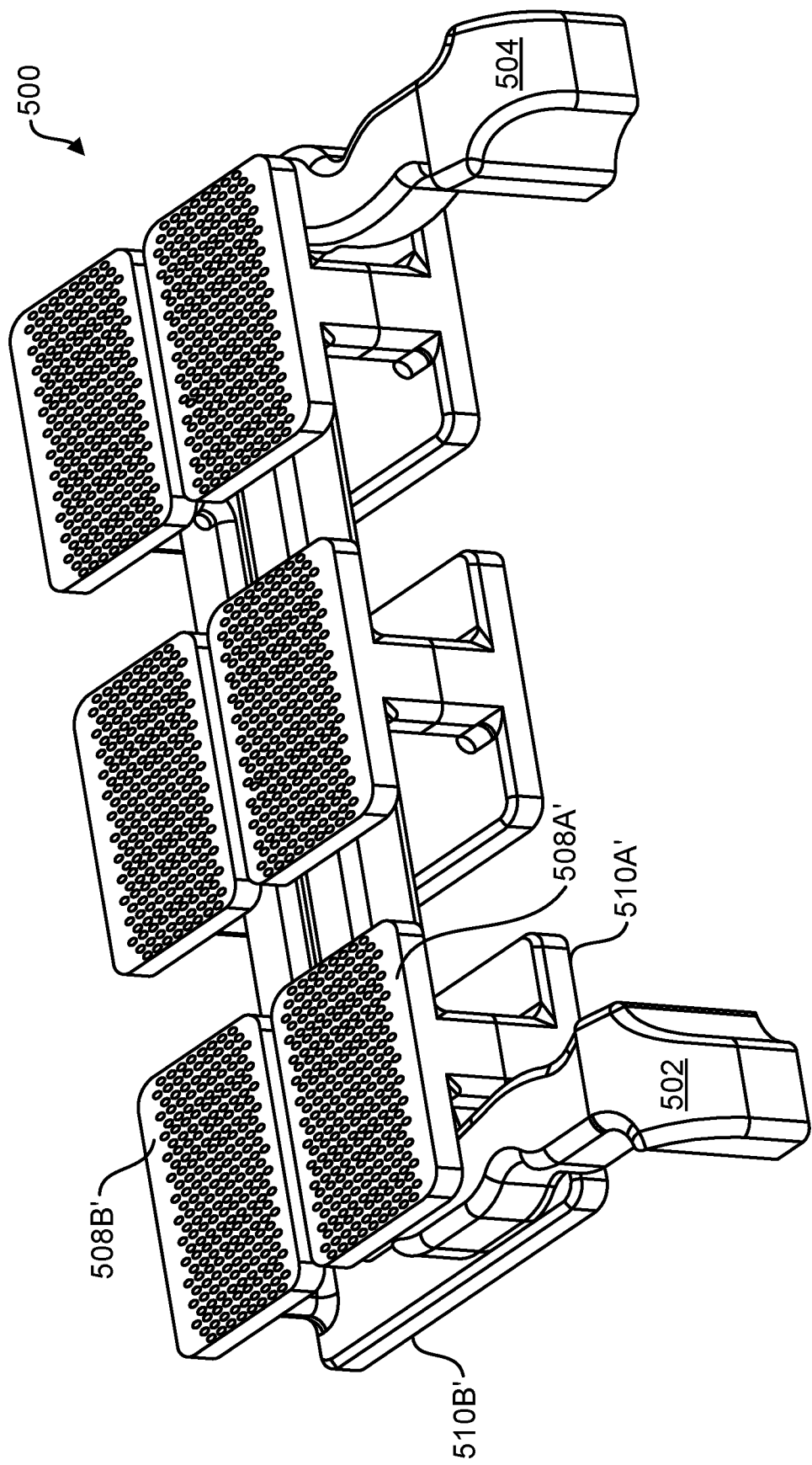
FIG. 7 shows a bottom view of another example of the fluid volume in FIG. 5 when pin fin plates are used.
Figure 8:
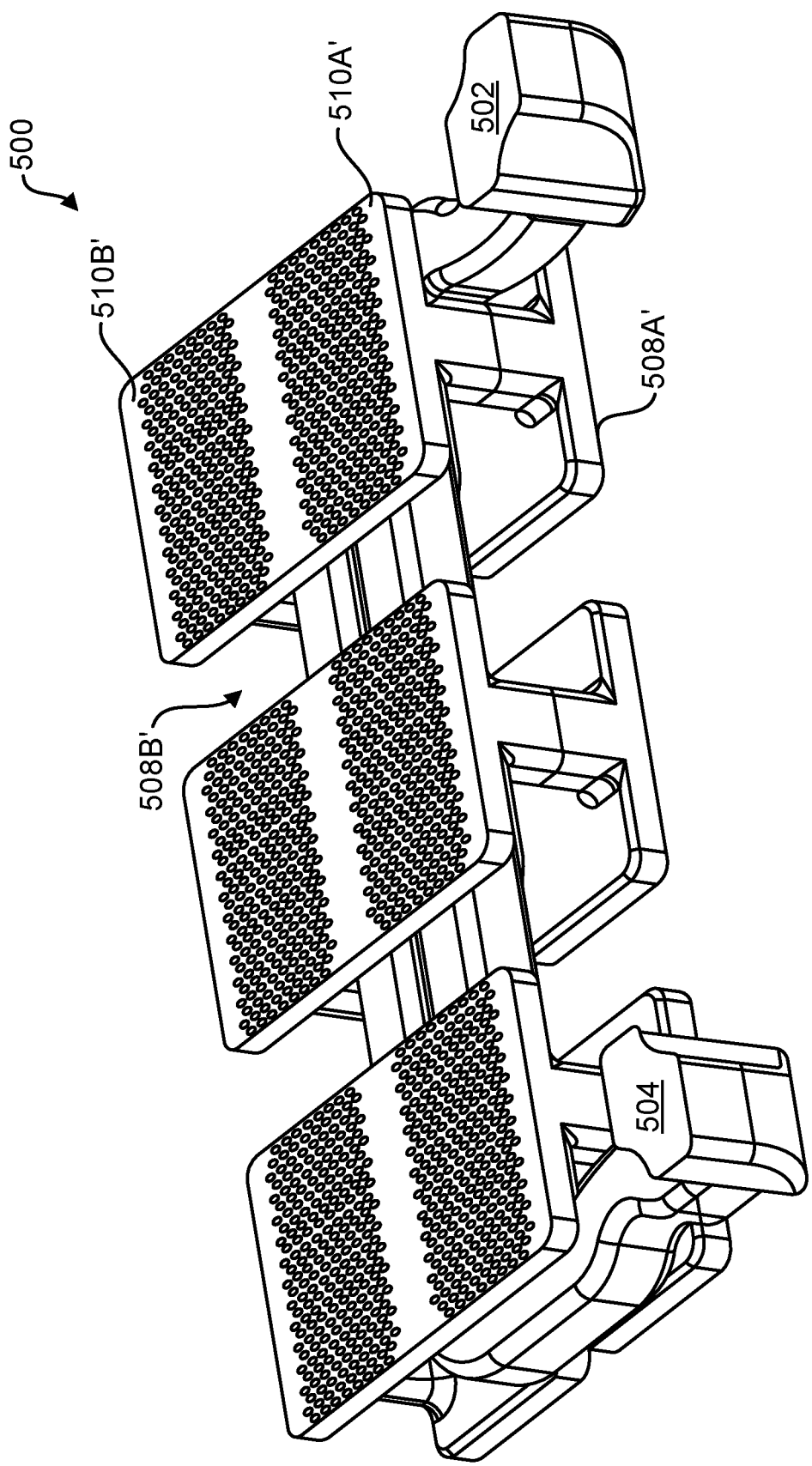
FIG. 8 shows a top view of the fluid volume in FIG. 7.

FIG. 7 shows a bottom view of another example of the fluid volume 500 in FIG. 5 when pin fin plates are used. FIG. 8 shows a top view of the fluid volume 500 in FIG. 7. Here, each of subplate portions 508A', 508B', 510A', and 510B' is further characterized in that it has a pattern formed by interaction between the coolant and pins of a pin fin plate (e.g., the pin fin plate 200 in FIG. 2). Accordingly, from the inlet portion 502 the flow can continue in the subplate portion 508A', thereafter in a subplate portion 510A', thereafter in a subplate portion 510B', and thereafter in a subplate portion 508B', before continuing to the outlet portion 504.

Figure 9:
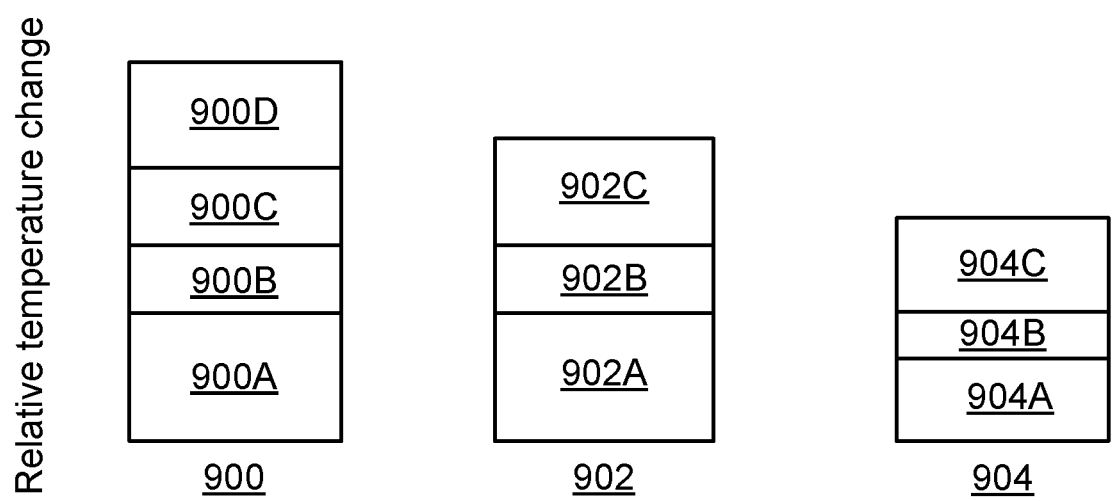
FIG. 9 shows examples of relative temperature changes.

FIG. 9 shows examples of relative temperature changes for coolers 900, 902, and 904. The cooler 900 is a traditional cooler using thermal grease, the cooler 902 is a cooler with regular manifold design not using thermal grease, and the cooler 904 is a cooler with a manifold according to the present disclosure. The coolers 900-904 use the same module in this example.

The relative temperature change is shown on a vertical axis, starting from a coolant temperature to a maximum junction temperature. With the cooler 900, the relative temperature changes correspond to coolant 900A, temperature variation 900B within all dies, thermal grease 900C, and example module 900D. With the cooler 902, the relative temperature changes correspond to coolant 902A, temperature variation 902B within all dies, and example module 902C. With the cooler 904, the relative temperature changes correspond to coolant 904A, temperature variation 904B within all dies, and example module 904C.

Figure 10:
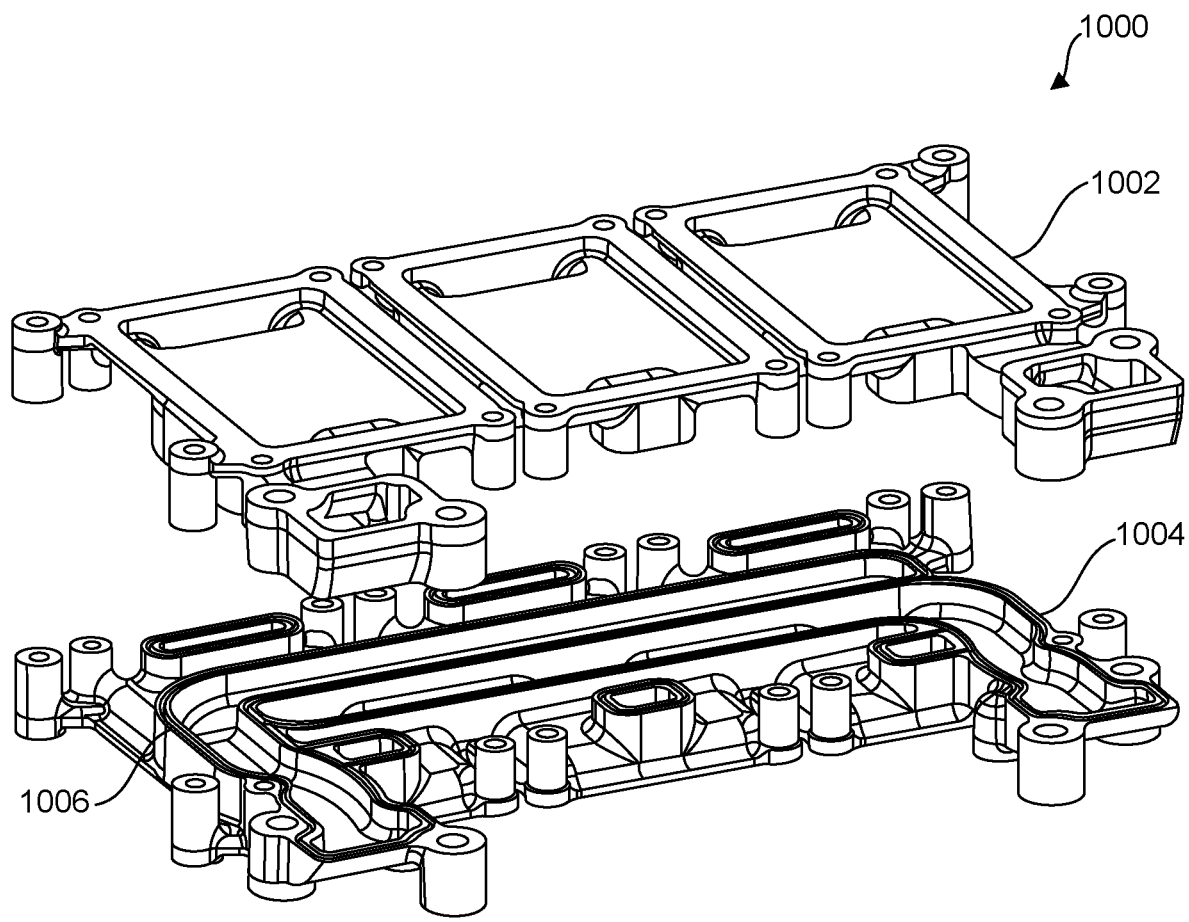
FIG. 10 shows an example of a cooler manufactured by casting or molding.

FIG. 10 shows an example of a cooler 1000 manufactured by casting or molding. The cooler 1000 can be used with one or more other examples described elsewhere herein. The cooler 1000 is made from at least a piece 1002 and a piece 1004. The pieces 1002-1004 can be assembled together, and joined to each other, to at least in part form: mounting surfaces (e.g., the mounting surfaces described with reference to FIG. 1), and an inlet and an outlet (e.g., the inlet/outlet described in examples above).

In some implementations, the pieces 1002-1004 are plastic pieces. For example, the pieces 1002-1004 can be molded from a polymer material. Any polymer material that can be formed into the shapes of the inlet, outlet, and coolant paths, and is compatible with the type of coolant, can be used. For example, injection molding or compression molding can be used. As another example, the pieces 1002-1004 are formed by a thermoplastic material or a composite material. In some implementations, vacuum infusion or 3D printing are used in forming the pieces 1002-1004. Other techniques and/or materials can be used.

In some implementations, the pieces 1002-1004 are metal pieces. For example, the pieces 1002-1004 can be cast from a metal (e.g., an element or an alloy of materials). As another example, the pieces 1002-1004 can be forged. Any metal that can be formed into the shapes of the inlet, outlet, and coolant paths, and is compatible with the type of coolant, can be used. For example, die casting from aluminum (alloy) can be used.

Any of multiple ways of joining and/or sealing the pieces 1002-1004 to form a joint 1006 that extends throughout the interface of the pieces 1002-1004 can be used. In some implementations, the joint 1006 includes an adhesive. This approach can be applied when the pieces 1002-1004 are metal and/or plastic. For example, the pieces 1002-1004 can be mated with a grooved surface and the adhesive can be dispensed between them.

In some implementations, the joint 1006 includes a vibration weld. This approach can be applied when the pieces 1002-1004 are plastic. In some implementations, a sacrificial geometry can be molded into one of the pieces 1002-1004. The pieces 1002-1004 can then be mated and vibrated against each other until the vibration weld is achieved.

In some implementations, the joint 1006 includes a seal and one or more bolt connections. This approach can be applied when the pieces 1002-1004 are metal and/or plastic. In some implementations, the joint 1006 can include a separate seal installed between the pieces 1002-1004. The pieces 1002-1004 can then be bolted down, which compresses the seal.

Figure 11:
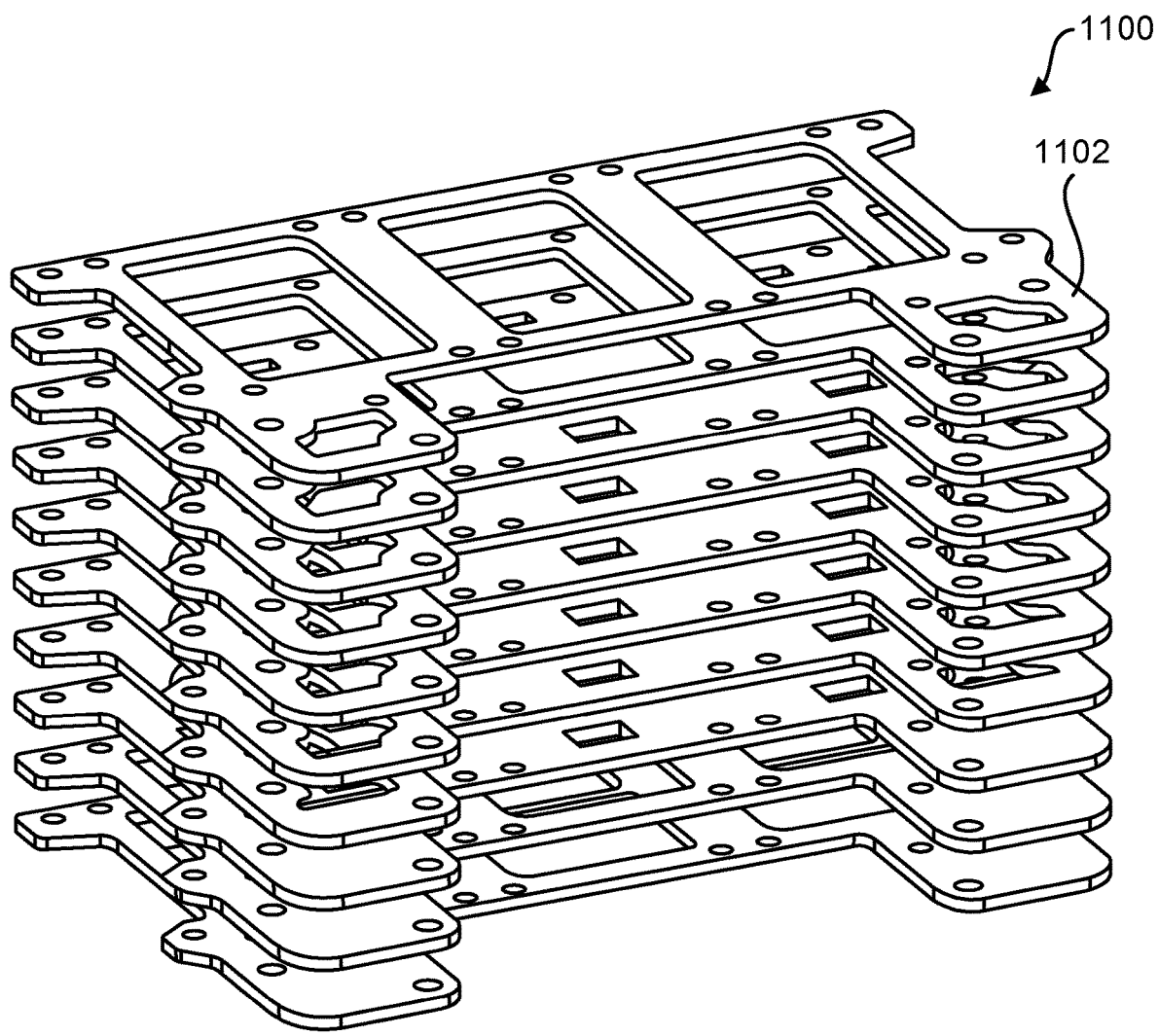
FIG. 11 shows an example of a cooler manufactured by lamination.

FIG. 11 shows an example of a cooler 1100 manufactured by lamination. The cooler 1100 can be used with one or more other examples described elsewhere herein. The cooler 1100 comprises a stack of laminates 1102 that are here shown separate from each other for clarity. The stack of laminates at least in part forms the first and second mounting surfaces, and the inlet and the outlet. Each of the laminates 1102 can be a relatively thin sheet (including, but not limited to, an aluminum stamping plate). Some or all of the laminates 1102 can have openings through them so that the stack at least in part forms the mounting surfaces, and an inlet and outlet of a cooler. For example, the stack of laminates 1102 can be assembled by brazing.

The terms "substantially" and "about" used throughout this Specification are used to describe and account for small fluctuations, such as due to variations in processing. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%. Also, when used herein, an indefinite article such as "a" or "an" means "at least one."

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

A number of implementations have been described. Nevertheless, it will be understood that various modifications may be made without departing from the spirit and scope of the specification.

In addition, the logic flows depicted in the figures do not require the particular order shown, or sequential order, to achieve desirable results. In addition, other processes may be provided, or processes may be eliminated, from the described flows, and other components may be added to, or removed from, the described systems. Accordingly, other implementations are within the scope of the following claims.

While certain features of the described implementations have been illustrated as described herein, many modifications, substitutions, changes and equivalents will now occur to those skilled in the art. It is, therefore, to be understood that appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A cooler for power electronics, the cooler comprising:
    first mounting surfaces for first power electronics modules, respectively;
    second mounting surfaces for second power electronics modules, respectively, each of the first mounting surfaces being parallel to and overlapping a corresponding one of the second mounting surfaces; and
    coolant paths extending between an inlet and an outlet, the coolant paths providing parallel flows among the first and second mounting surfaces, wherein each of the parallel flows initially abuts a first half of a first one of the first mounting surfaces, thereafter abuts a first half of a first one of the second mounting surfaces, thereafter abuts a second half of the first one of the second mounting surfaces, and thereafter abuts a second half of the first one of the first mounting surfaces.

2. The cooler of claim 1, wherein the inlet leads to an inlet manifold extending through a space between the first and second mounting surfaces, the inlet manifold positioned substantially at a center of the space.

3. The cooler of claim 2, wherein the outlet leads to an outlet manifold, the outlet manifold also extending through the space between the first and second mounting surfaces, the outlet manifold positioned adjacent the inlet manifold.

4. The cooler of claim 3, wherein the coolant paths define a fluid volume of coolant flowing through the cooler, the fluid volume having i) an inlet portion formed by the inlet, ii) an inlet manifold portion extending from the inlet portion, the inlet manifold portion formed by the inlet manifold and constituting a branching of a coolant flow, iii) an outlet manifold portion after the inlet manifold portion, the outlet manifold portion formed by the outlet manifold, and iv) an outlet portion formed by the outlet;
    wherein each of the parallel flows initially abuts the first half of the first one of the first mounting surfaces in a first subplate portion, thereafter abuts the first half of the first one of the second mounting surfaces in a second subplate portion, thereafter abuts the second half of the first one of the second mounting surfaces in a third subplate portion, and thereafter abuts the second half of the first one of the first mounting surfaces in a fourth subplate portion;

wherein the first subplate portion and the fourth subplate portion are not in immediate fluid contact with each other; and wherein the second subplate portion and the third subplate portion are in immediate fluid contact with each other.

5. The cooler of claim 1, wherein the cooler has three instances of the first mounting surfaces and three instances of the second mounting surfaces.

6. The cooler of claim 1, further comprising first pin fin plates for the first mounting surfaces, respectively, and second pin fin plates for the second mounting surfaces, respectively.

7. The cooler of claim 1, wherein the cooler comprises a stack of laminates, the stack of laminates at least in part forming the first and second mounting surfaces, and the inlet and the outlet.

8. The cooler of claim 1, wherein the cooler comprises a first piece and a second piece, and wherein the first and second pieces are joined together to at least in part form: the first and second mounting surfaces, and the inlet and the outlet.

9. The cooler of claim 8, wherein each of the first and second pieces is molded.

10. The cooler of claim 8, wherein each of the first and second pieces is 3D printed.

11. The cooler of claim 8, wherein each of the first and second pieces is formed by vacuum infusion.

12. The cooler of claim 8, further comprising an adhesive at a joint between the first and second pieces.

13. The cooler of claim 8, further comprising a seal at a joint between the first and second pieces, and at least one bolt connection between the first and second pieces.

14. The cooler of claim 1, wherein the cooler comprises a first metal piece and a second metal piece, and wherein the first and second metal pieces are joined together to at least in part form: the first and second mounting surfaces, and the inlet and the outlet.

15. The cooler of claim 14, wherein the first and second metal pieces are cast.

16. The cooler of claim 14, wherein the first and second metal pieces are forged.

17. The cooler of claim 14, wherein the first and second metal pieces are 3D printed.

18. The cooler of claim 14, further comprising an adhesive at a joint between the first and second metal pieces.

19. The cooler of claim 14, further comprising a seal at a joint between the first and second metal pieces, and at least one bolt connection between the first and second metal pieces.

20. The cooler of claim 1, wherein the cooler is cast or molded as a single piece.

* * * * *